(12) United States Patent
Yu et al.

(10) Patent No.: US 9,054,047 B2
(45) Date of Patent: Jun. 9, 2015

(54) EXPOSING CONNECTORS IN PACKAGES THROUGH SELECTIVE TREATMENT

(71) Applicant: Taiwan Semiconductor Manufacturing Company, Ltd., Hsin-Chu (TW)

(72) Inventors: Chen-Hua Yu, Hsinchu (TW); Chung-Shi Liu, Hsin-Chu (TW); Chun-Cheng Lin, New Taipei (TW); Meng-Tse Chen, Changzhi Township (TW); Ming-Da Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/157,617

(22) Filed: Jan. 17, 2014

(65) Prior Publication Data

US 2014/0131896 A1 May 15, 2014

Related U.S. Application Data

(62) Division of application No. 13/331,061, filed on Dec. 20, 2011, now Pat. No. 8,664,040.

(51) Int. Cl.
| | |
|---|---|
| H01L 23/48 | (2006.01) |
| H01L 23/52 | (2006.01) |
| H01L 29/40 | (2006.01) |
| H01L 23/31 | (2006.01) |
| H01L 21/56 | (2006.01) |
| H01L 23/498 | (2006.01) |
| H01L 23/00 | (2006.01) |

(52) U.S. Cl.
CPC ....... *H01L 23/31* (2013.01); *H01L 2224/16225* (2013.01); *H01L 2224/32225* (2013.01); *H01L 2224/73204* (2013.01); *H01L 2924/15192* (2013.01); *H01L 2924/15321* (2013.01); *H01L 2924/18161* (2013.01); *H01L 23/3121* (2013.01); *H01L 21/563* (2013.01); *H01L 21/565* (2013.01); *H01L 23/49816* (2013.01); *H01L 23/49827* (2013.01); *H01L 24/14* (2013.01)

(58) Field of Classification Search
USPC ......... 257/782, 678, 734, 735, 736, 737, 779, 257/772, E21.006, E21.007, E21.027, 257/E21.058, E21.221, E21.227, E21.245, 257/E21.311, E21.314
See application file for complete search history.

(56) References Cited

U.S. PATENT DOCUMENTS

| | | | |
|---|---|---|---|
| 8,344,495 B2 | 1/2013 | Camacho et al. | |
| 8,598,715 B2 * | 12/2013 | Chen | 257/774 |
| 8,643,148 B2 * | 2/2014 | Lin et al. | 257/620 |
| 8,658,464 B2 * | 2/2014 | Cheng et al. | 438/106 |
| 8,664,040 B2 * | 3/2014 | Yu et al. | 438/106 |
| 2009/0028491 A1 | 1/2009 | Fillion et al. | |
| 2011/0299821 A1 | 12/2011 | Fillion et al. | |
| 2012/0043575 A1 | 2/2012 | Kim et al. | |

* cited by examiner

Primary Examiner — David Nhu
(74) Attorney, Agent, or Firm — Slater & Matsil, L.L.P.

(57) ABSTRACT

A method includes performing an etching step on a package. The package includes a package component, a connector on a top surface of the package component, a die bonded to the top surface of the package component, and a molding material molded over the top surface of the package component. The molding material covers the connector, wherein a portion of the molding material covering the connector is removed by the etching step, and the connector is exposed.

20 Claims, 5 Drawing Sheets

EXPOSING CONNECTORS IN PACKAGES
THROUGH SELECTIVE TREATMENT

This application is a divisional of U.S. patent application Ser. No. 13/331,061, entitled "Exposing Connectors in Packages through Selective Treatment," filed on Dec. 20, 2011, issued as U.S. Pat. No. 8,664,040, which application is incorporated herein by reference.

BACKGROUND

In a conventional package-on-package (POP) process, a top package, in which a first device die is bonded, is bonded to a bottom package. The bottom package may also have a device die packaged therein. By adopting the PoP process, the integration level of the packages may be increased.

In an existing PoP process, a bottom package is formed first, which comprises a device die bonded to a package substrate. A molding compound is then molded on the package substrate, wherein the device die is molded in the molding compound. The package substrate further comprises connectors that are on the same side of the package substrate as the device die. The connectors are used for connecting the bottom package to a top package. Through-molding openings are then formed in the molding compound, so that the connectors are exposed through the through-molding openings. In the formation of the through-molding openings, laser drill is used to remove portions of the molding compound that cover the connectors. After the laser drill, however, the molding compound residue may be left on the surfaces of the connectors.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package and the method of forming the same are provided in accordance with various embodiments. The intermediate stages of forming the packages are illustrated in accordance with some embodiments. The variations of the embodiments are discussed. Throughout the various views and illustrative embodiments, like reference numbers are used to designate like elements.

Figure 1:
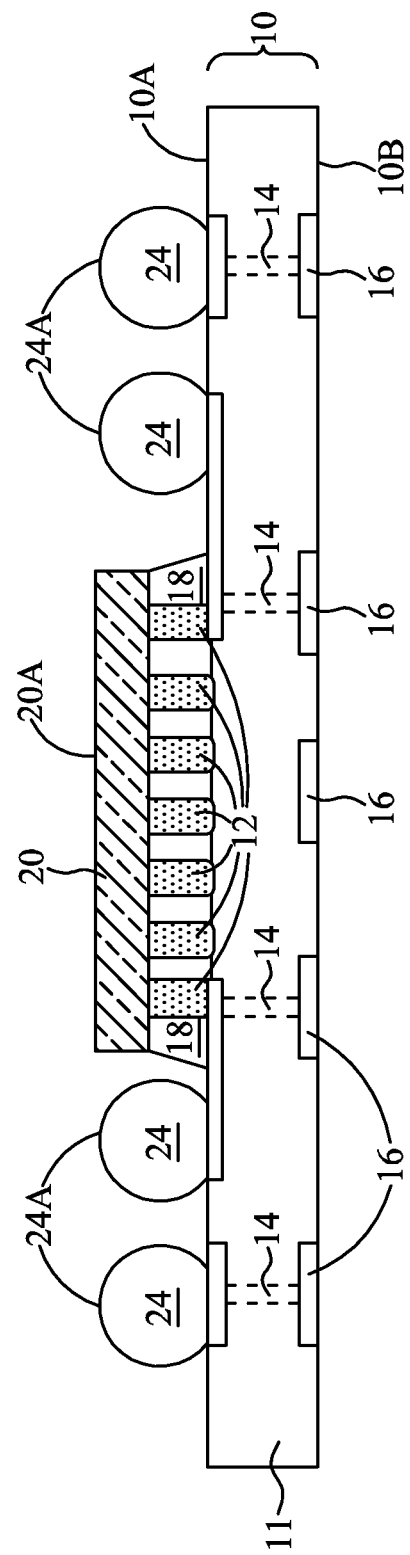
FIGS. 1 through 3C are cross-sectional views of intermediate stages in the manufacturing of a package in accordance with some exemplary embodiments.

Referring to FIG. 1, package component 10 is provided. In some embodiments, package component 10 is an interposer. In alternative embodiments, package component 10 is a package substrate. Package component 10 may comprise substrate 11 that is formed of a semiconductor material such as silicon. Alternatively, substrate 11 is formed of a dielectric material. Substrate 11 may also be a laminate substrate which includes laminated dielectric films. Package component 10 is configured to electrically couple connectors 12 on first surface 10A to conductive features 16 on second surface 10B, wherein surfaces 10A and 10B are opposite surfaces of package component 10. Conductive features 16 may be metal pads, for example. Package component 10 may include metal lines/vias 14 therein. Alternatively, features 14 comprise through-vias penetrating through substrate 11.

Package component 20 is bonded to package component 10 through connectors 12. Package component 20 may be a die, and hence is alternatively referred to as die 20 herein after, although it may also be another type of package component such as a package. Die 20 may be a device die comprising integrated circuit devices (not shown) such as transistors, capacitors, inductors, resistors, and the like. The bonding of die 20 to connectors 12 may be a solder bonding or a direct metal-to-metal bonding (such as copper-to-copper bonding). Underfill 18 may be dispensed into the gap between die 20 and package component 10.

Connectors 24 are formed on the top surface of package component 10. Connectors 24 may be electrically coupled to connectors 12 and conductive features 16. In some embodiments, connectors 24 may be solder balls. Alternatively, connectors 24 may comprise metal pads, metal pillars, solder caps formed on metal pillars, and/or the like. The solder regions of connectors 24 (such as the solder ball or the reflowed solder cap) may have round top surfaces, although the top surfaces of the solder regions may also be planar. Connectors 24 are not covered by die 20. In some embodiments, top ends 24A of connectors 24 are higher than the top surface 20A of die 20. In alternative embodiments, top ends 24A of connectors 24 are substantially level with, or lower than, top surface 20A of die 20.

Figure 2:
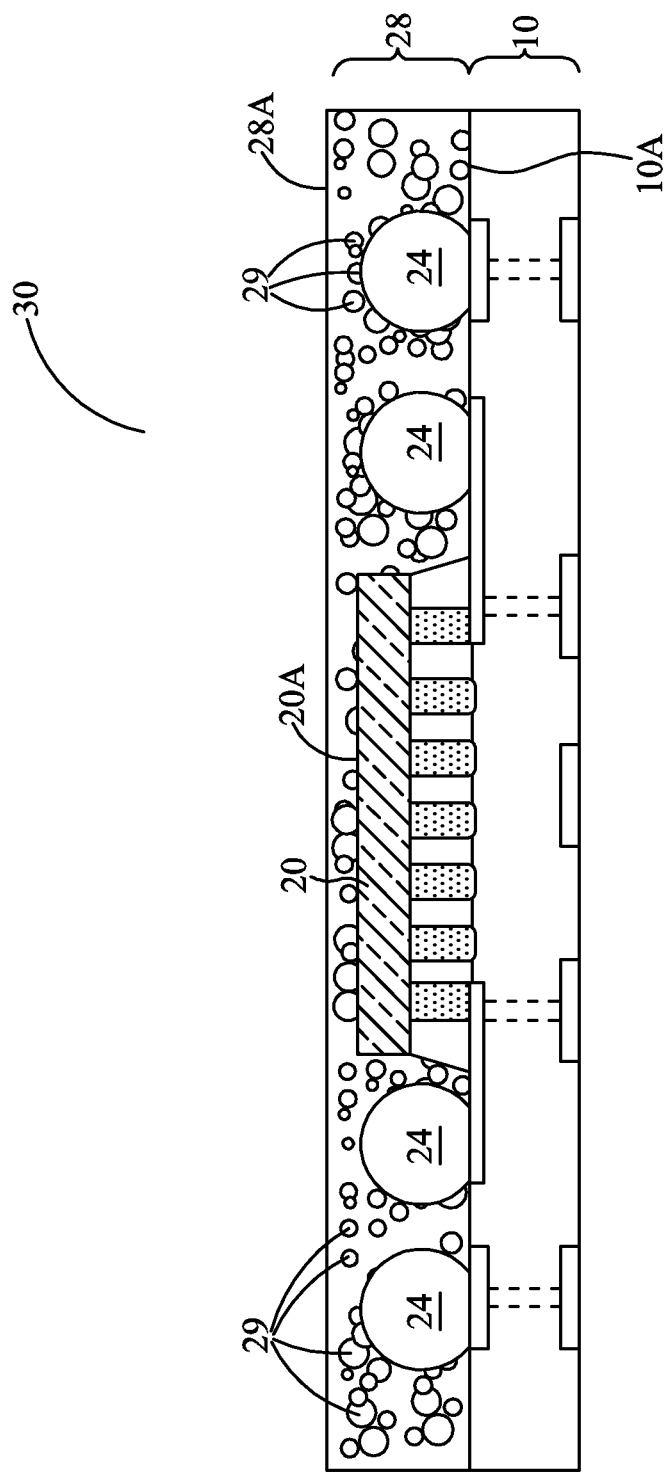

Referring to FIG. 2, molding material 28 is molded on die 20 and package component 10. Molding material 28 may be applied in the form of a film, a liquid, a solid tablet, a gel, a grease, or the like. A curing process may be performed after molding material 28 is applied. Molding material 28 may include a filler (schematically illustrated as 29), a polymer, and a hardener in accordance with some embodiments. In an exemplary embodiment, the polymer may be a molding compound, an underfill, a Molding Underfill (MUF), an epoxy, a Thermal Interface Material (TIM), or the like. The filler may comprise $SiO_2$, $ZnO_2$, metal particles of silver (Ag), gold (Au), copper (Cu), and/or aluminum (Al), and combinations thereof. The hardener may comprise Amin, phenol, acid anhydride, or combinations thereof. Molding material 28 may cover die 20, and may be in contact with top surfaces 20A of die 20, the edges of die 20, and top surface 10A of package component 10. Molding material 28 may be molded onto die 20 and package component 10 using, for example, compression molding or transfer molding. Top surface 28A of molding material 28 may be higher than top surface 20A of die 20, and die 20 may be fully encapsulated in molding material 28. A grinding may be performed to remove the portions of molding material 28, which portions are over top surface 20A of die 20, and hence top surface 20A is exposed, and is level with top surface 28A of molding material 28. Throughout the description, the structure shown in FIG. 2 is referred to as package 30.

Figure 3A:
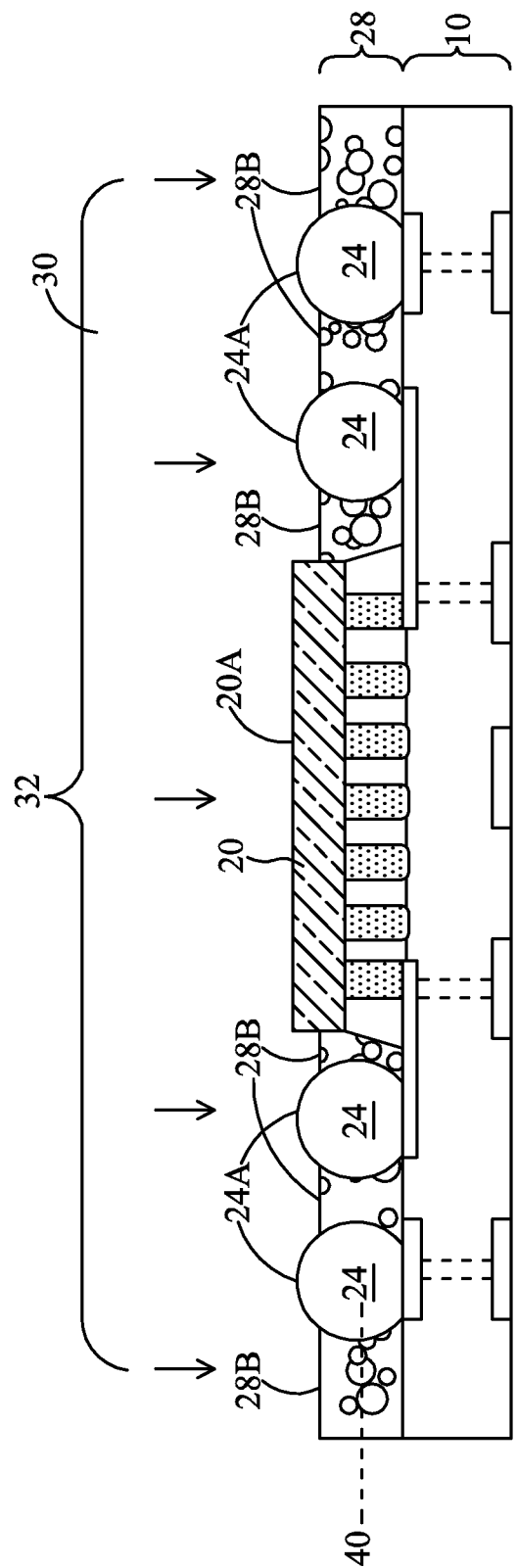
Figure 3B:
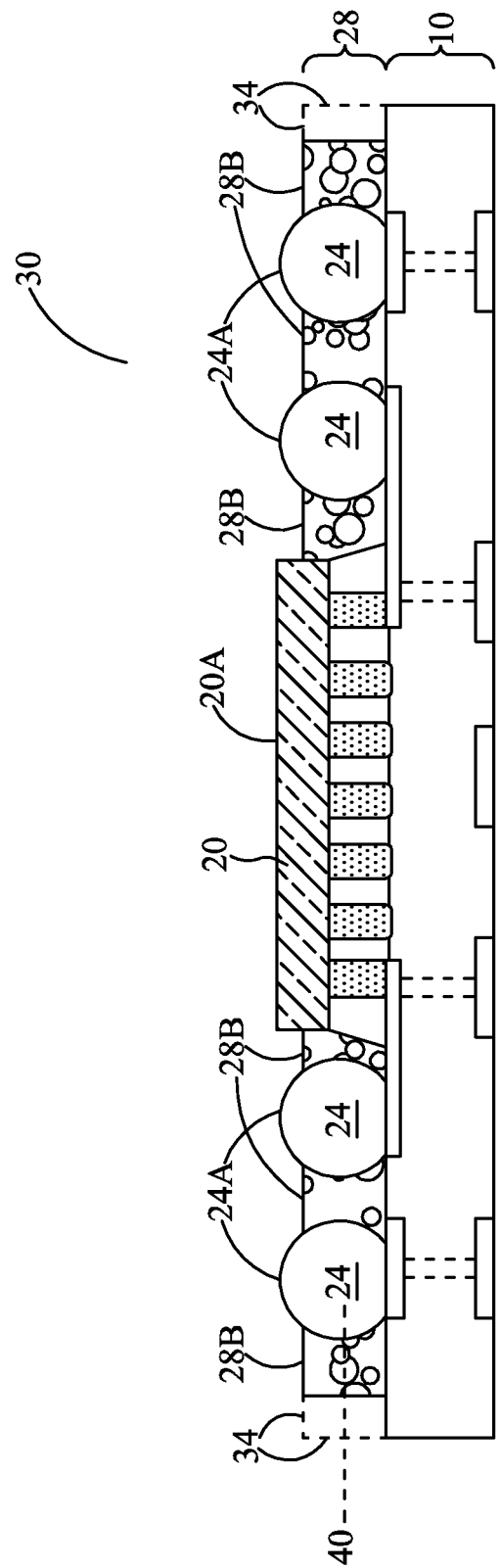
Figure 3C:
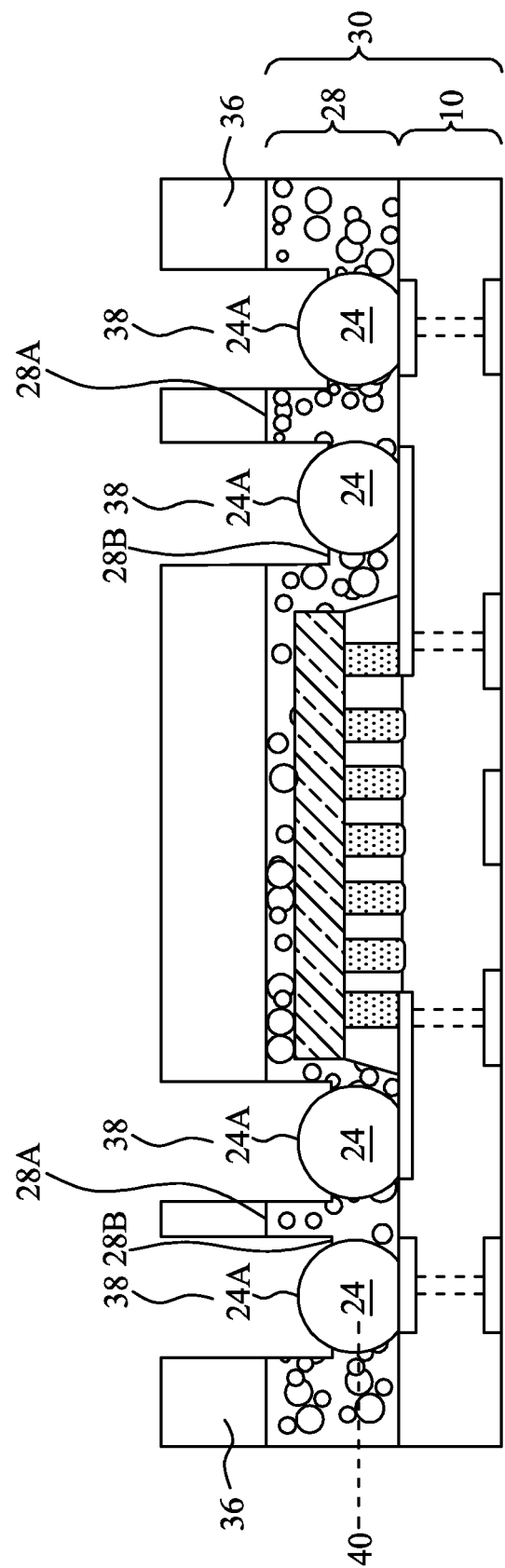

FIGS. 3A through 3C illustrate the exemplary embodiments for exposing connectors 24, wherein the exposure of connectors 24 is performed through a treatment. The treatment may comprise a dry etching (a plasma etching), a wet etching, or the like. After the treatment, the top portions of connectors 24 are exposed. Referring to FIG. 3A, an anisotropic treatment (symbolized by arrows 32) may be performed to remove a top layer of molding material 28, so that top portions of connectors 24 are exposed. In the treatment, an appropriate process gas may be selected according to molding material 28, including the materials of polymer, the filler, and the hardener, so that molding material 28 is etched, while die 20, connectors 24, and/or the like are not etched. In some exemplary embodiments, the treatment may be performed using the plasma etching, wherein $CF_4$ and oxygen ($O_2$) may be used as the etchant gas. In alternative embodiments, the treatment may be performed using the plasma etching, wherein argon (Ar) and oxygen ($O_2$) may be used as the etchant gas. With the plasma turned on, the treatment may be anisotropic, although it may also be isotropic. In the embodiments wherein the anisotropic treatment is performed, the etching is in the vertical direction (the direction of arrows 32). The horizontal removal/etching, if any, is minimized. In some embodiments, after the exposure of connectors 24, top surface 20A of die 20 may be exposed if die 20 was covered by polymer material 28 before the treatment. During the treatment, the top surface material of die 20 may be used as an etch stop layer.

FIG. 3B illustrates alternative embodiments, wherein an isotropic etching, for example, a wet etching, is performed to expose connectors 24. As a result, the edges of molding material 28 may be etched, wherein dashed lines 34 illustrate the positions of molding material 28 before the treatment. In the treatment, appropriate etchants may be selected according to molding material 28, including the materials of polymer, the filler, and the hardener, so that connectors 24 are exposed, while die 20, connectors 24, and/or the like are not damaged. In some exemplary embodiment, the treatment is performed using nitric acid ($HNO_3$) as the etchant, which forms a part of the etching solution.

In the embodiments shown in FIGS. 3A and 3B, top surface 28A of the resulting molding material 28 may be substantially planar. FIGS. 3A and 3B also illustrate some neighboring connectors 24, with molding material 28 disposed between the neighboring connectors 24. After the treatment, the recessed top surface 28B of the portion of molding material 28 may be lower than top ends 24A of connectors 24. Furthermore, in some embodiments, none of the recessed top surface portions 28B between neighboring connectors 24 is higher than top ends 24A. In some other embodiments, the entirety of molding material 28 is located below top ends 24A, and may be, or may not be, below top surface 20A of die 20.

The etching as shown in FIGS. 3A and 3B may be performed with no etching mask formed to cover package 30. In other embodiments, as shown in FIG. 3C, etching mask 36 is formed over package 30, and is then patterned. Openings 38 in patterned etching mask 36 are over and aligned to connectors 24. Etching mask 36 may be formed of a photo resist, for example. During the etching step, portions of molding material 28 are removed through openings 38, so that connectors 24 are exposed. In the resulting structure, molding material 28 has top surfaces 28A that are higher than top ends 24A of connectors 24, and top surfaces 28B that are lower than top ends 24A of connectors 24. In these embodiments, the portions of molding material 28 between neighboring connectors 24 may also include top surfaces 28A that are higher than top ends 24A of connectors 24, and top surfaces 28B that are lower than top ends 24A of connectors 24. After the etching step, etching mask 36 is removed.

Referring again to FIGS. 3A through 3C, top surfaces 28B of molding material 28 may be as low as leveling with line 40, wherein line 40 is level with a middle level of the top ends and bottom ends of connectors 24. Alternatively, top surface 28B of recessed molding material 28 may be at an intermediate level between line 40 and top ends 24A of connectors 24. Since connectors 24 are not etched in the treatment, after the treatment, connectors 24 may have round top surfaces or planar top surfaces, depending on whether the top surfaces of connectors 24 are round or planar before the treatment of molding material 28.

In the existing process for exposing connectors, laser drill is used to remove the portions of molding compound over connectors 24. Accordingly, the laser used in the laser drill needs to be accurately aligned to the connectors. After the laser drill, the residue of the molding compound may be left on the surfaces of connectors. This adversely affects the reliability of the resulting package. By using the embodiments, however, no molding compound residue remains after the exposure of connectors. The process time for exposing connectors may also be reduced. Furthermore, there is no need to align to the connectors for the exposure of the connectors. The process difficulty is thus reduced.

In accordance with embodiments, a method includes performing an etching step on a package. The package includes a package component, a connector on a top surface of the package component, a die bonded to the top surface of the package component, and a molding material molded over the top surface of the package component. The molding material covers the connector, wherein a portion of the molding material covering the connector is removed by the etching step, and the connector is exposed.

In accordance with other embodiments, a method includes bonding a die to a top surface of a package substrate, with a plurality of solder regions disposed on the top surface, and molding a molding material over the top surface of the package substrate. The molding material covers the plurality of solder regions, wherein the molding material comprises a polymer. A treatment is performed to remove a portion of the molding material covering the solder region. After the treatment, a top portion of each of the plurality of solder regions is exposed, and an entirety of a top surface of a portion of the molding material is lower than top ends of the plurality of solder regions. The portion of the molding material is between two neighboring ones of the plurality of solder regions.

In accordance with yet other embodiments, a package includes a package component, a die bond to a top surface of the package component, a plurality of solder regions disposed on the top surface of the package component, and a molding material disposed over the top surface of the package component. Lower portions of the plurality of solder regions are disposed in the molding material, and an entirety of a top surface of the molding material between two neighboring ones of the plurality of solder regions is lower than top ends of the plurality of solder regions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
a package component;
a die bonded to a top surface of the package component;
a plurality of solder regions disposed over the top surface of the package component; and
a molding material disposed over the top surface of the package component, wherein lower portions of the plurality of solder regions are disposed in the molding material, and wherein an entirety of a top surface of the molding material between two neighboring ones of the plurality of solder regions is lower than top ends of the plurality of solder regions.

2. The package of claim 1, wherein substantially an entirety of the molding material is lower than the top ends of the plurality of solder regions.

3. The package of claim 2, wherein all top surfaces of the molding material are substantially coplanar with each other, and wherein the plurality of solder regions comprises round top surfaces.

4. The package of claim 1, wherein a top surface of the die is not covered by the molding material.

5. The package of claim 4, wherein the top surface of the die is higher than the entirety of the top surface of the molding material.

6. The package of claim 1, wherein the molding material comprises a polymer, a filler, and an hardener.

7. The package of claim 1, wherein the package component comprises a first edge substantially perpendicular to a top surface of the package component, and the molding material comprises a second edge perpendicular to the top surface of the package component, with the first edge and the second edge being on a same side of the die, and wherein the first edge is misaligned with the second edge.

8. The package of claim 1, wherein the package component extends beyond edges of the molding material.

9. A package comprising:
a package substrate;
a die bonded to the package substrate, wherein the die is overlying the package substrate;
a plurality of solder regions bonded to a top surface of the package substrate, wherein the plurality of solder regions has rounded top surfaces; and
a molding compound molding lower portions of the plurality of solder regions therein, wherein all top surfaces of the molding compound is coplanar, and is lower than top ends of the plurality of solder regions.

10. The package of claim 9, wherein the top ends of the plurality of solder regions are higher than a top surface of the die.

11. The package of claim 9, wherein the top ends of the plurality of solder regions are lower than a top surface of the die.

12. The package of claim 9, wherein the top ends of the plurality of solder regions are coplanar with a top surface of the die.

13. The package of claim 9, wherein the plurality of solder regions comprises bottom surfaces contacting a top surface of the package substrate, and wherein substantially entireties of surfaces of the plurality of solder regions that are over the bottom surfaces are rounded.

14. The package of claim 9, wherein the molding compound comprises an edge perpendicular to a major top surface of the package substrate, and wherein the package substrate extends beyond the edge of the molding compound.

15. A package comprising:
a package substrate;
a die bonded to the package substrate, wherein the die is overlying the package substrate;
a plurality of solder regions bonded to a top surface of the package substrate, wherein the plurality of solder regions have rounded top surfaces; and
a molding compound molding lower portions of solder regions therein, wherein the molding compound comprises a planar top surface joining a sidewall of the die, and wherein a joining point of the planar top surface and the sidewall of the die is lower than a top surface of the die.

16. The package of claim 15, wherein entireties of top surfaces of the plurality of solder regions are rounded, and wherein the entireties of top surfaces are higher than the planar top surface of the molding compound.

17. The package of claim 15, wherein all top surfaces of the molding compound are coplanar with each other.

18. The package of claim 15, wherein top ends of the plurality of solder regions are lower than a top surface of the die.

19. The package of claim 15, wherein the plurality of solder regions comprises bottom surfaces contacting a top surface of the package substrate, and wherein substantially entireties of surfaces of the plurality of solder regions over the bottom surfaces are rounded.

20. The package of claim 15, wherein the package substrate extends beyond edges of the molding compound.

* * * * *